(12) United States Patent
Kobori

(10) Patent No.: US 8,872,415 B2
(45) Date of Patent: Oct. 28, 2014

(54) SUBSTRATE, DISPLAY PANEL, AND DISPLAY APPARATUS

(71) Applicant: Sony Corporation, Tokyo (JP)

(72) Inventor: Isamu Kobori, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/017,704

(22) Filed: Sep. 4, 2013

(65) Prior Publication Data

US 2014/0084775 A1    Mar. 27, 2014

(30) Foreign Application Priority Data

Sep. 21, 2012  (JP) .................................. 2012-208128

(51) Int. Cl.
| | |
|---|---|
| H05B 33/02 | (2006.01) |
| H01J 5/16 | (2006.01) |
| H01J 61/40 | (2006.01) |
| H01K 1/26 | (2006.01) |
| H01K 1/30 | (2006.01) |
| F21V 13/02 | (2006.01) |

(52) U.S. Cl.
CPC ..................................... F21V 13/02 (2013.01)
USPC .......................................... 313/111; 313/116

(58) Field of Classification Search
CPC ................. H01L 51/52; H05B 33/02
USPC .................................................. 313/498–512
See application file for complete search history.

(56) References Cited

U.S. PATENT DOCUMENTS

| | | | | |
|---|---|---|---|---|
| 2006/0244371 | A1* | 11/2006 | Cok et al. | 313/506 |
| 2007/0103056 | A1* | 5/2007 | Cok | 313/503 |
| 2008/0061687 | A1* | 3/2008 | Cok et al. | 313/506 |

FOREIGN PATENT DOCUMENTS

| | | |
|---|---|---|
| JP | 2002-270365 A | 9/2002 |
| JP | 2003-162229 A | 6/2003 |
| JP | 2009-272591 | 11/2009 |

\* cited by examiner

*Primary Examiner* — Donald Raleigh

(74) *Attorney, Agent, or Firm* — Rader, Fishman & Grauer PLLC

(57) ABSTRACT

A substrate includes: a plurality of pixels arranged two-dimensionally on a common wiring substrate, and each including a plurality of types of light emitting elements that differ from one another in emission color; a plurality of light-scattering sections each provided for a corresponding one of the pixels, and each provided above the corresponding one of the pixels; and a light-shielding section provided in a gap between adjacent ones of the pixels, or provided in an opposing region that opposes the gap when viewed in a normal direction of the wiring substrate.

9 Claims, 18 Drawing Sheets

| | LOWER-SIDE BL | LOWER-SIDE SL | UPPER-SIDE BL | UPPER-SIDE CL | UPPER-SIDE SL |
|---|---|---|---|---|---|
| FIG. 1~FIG. 13 | ○ | ○ | ○ | × | × |
| FIG. 14, FIG. 15 | × | ○ | ○ | × | × |
| FIG. 16 | ○ | ○ | × | × | × |
| FIG. 17 | ○ | ○ | ○ | ○ | × |
| FIG. 18, FIG. 19 | × | ○ | ○ | ○ | × |
| FIG. 20~FIG. 23 | ○ | ○ | × | ○ | × |
| FIG. 24, FIG. 25 | ○ | × | ○ | × | ○ |
| FIG. 26, FIG. 27 | × | × | ○ | × | ○ |
| FIG. 28 | ○ | × | × | × | ○ |
| FIG. 29 | ○ | × | ○ | ○ | ○ |
| FIG. 30, FIG. 31 | × | × | ○ | ○ | ○ |
| FIG. 32, FIG. 33 | ○ | × | × | ○ | ○ |

SUBSTRATE, DISPLAY PANEL, AND DISPLAY APPARATUS

CROSS REFERENCE TO RELATED APPLICATIONS

This application claims the benefit of priority under 35 U.S.C. §119 from Japanese Priority Patent Application JP 2012-208128 filed on Sep. 21, 2012, the entire contents of each which is incorporated herein by reference.

BACKGROUND

The present technology relates to a substrate which includes a plurality of light emitting diodes (LEDs) for each pixel, and a display panel that includes the one or more substrates. In addition, the present technology relates to a display apparatus that includes the above display panel.

With the recent increase in luminance of inorganic blue light emitting diodes (LEDs), a full-color LED display in which light beams of primary colors, including red, green, and blue, are emitted from LEDs is proposed (see Japanese Unexamined Patent Application Publication No. 2009-272591). In such a full-color LED display, it is very important for the LEDs of the respective emission colors in each pixel to exhibit the same directivity, in terms of the dependence of the coloration on the viewing-angle. In fact, however, the LEDs of the emission colors in each pixel slightly differ in directivity. It is accordingly necessary to take measures to reduce the dependence of the coloration on the viewing-angle.

To give an example, Japanese Unexamined Patent Application Publication No. 2002-270365 describes a display apparatus in which a plurality of inorganic electroluminescence (EL) elements that emit light beams of different colors are provided in each pixel. In this display apparatus, a light-scattering substance is provided on a side of each inorganic EL element from which light is extracted. Providing this light-scattering substance on the light-extraction side of each LED makes it possible to reduce the dependence of the coloration on the viewing-angle. To give another example, Japanese Unexamined Patent Application Publication No. 2003-162229 describes that a diffusing film is provided in an overall display region on a front surface of a counter substrate.

SUMMARY

In the above patent document No. 2002-270365, disadvantageously, providing the light-scattering substance on the light-extraction side of each LED may cause an image to be blurred. This is because no LED-light blocking member is provided between the adjacent pixels, in which case the light beams emitted from the LEDs would enter the adjacent pixels. Likewise, in the above Patent document No. 2003-162229, forming the diffusing film in the overall display region may also cause an image to be blurred. This is because the light beams emitted from the LEDs would propagate inside the diffusing film, and be output at an undesired site. In addition, external light may be reflected by the diffusing film, causing the reduction in the contrast.

It is desirable to provide: a substrate that is capable of reducing dependence of coloration on a viewing-angle while suppressing blurring of an image and a reduction in a contrast of the image; a display panel that includes one or more such substrates; and a display apparatus that includes such a display panel.

A substrate according to an embodiment of the present technology includes: a plurality of pixels arranged two-dimensionally on a common wiring substrate, and each including a plurality of types of light emitting elements that differ from one another in emission color; a plurality of light-scattering sections each provided for a corresponding one of the pixels, and each provided above the corresponding one of the pixels; and a light-shielding section provided in a gap between adjacent ones of the pixels, or provided in an opposing region that opposes the gap when viewed in a normal direction of the wiring substrate.

A display panel according to an embodiment of the present technology is provided with one or a plurality of substrates. The one or the plurality of substrates each include: a plurality of pixels arranged two-dimensionally on a common wiring substrate, and each including a plurality of types of light emitting elements that differ from one another in emission color; a plurality of light-scattering sections each provided for a corresponding one of the pixels, and each provided above the corresponding one of the pixels; and a light-shielding section provided in a gap between adjacent ones of the pixels, or provided in an opposing region that opposes the gap when viewed in a normal direction of the wiring substrate.

A display apparatus according to an embodiment of the present technology is provided with a display panel. The display panel is provided with one or a plurality of substrates. The one or the plurality of substrates each include: a plurality of pixels arranged two-dimensionally on a common wiring substrate, and each including a plurality of types of light emitting elements that differ from one another in emission color; a plurality of light-scattering sections each provided for a corresponding one of the pixels, and each provided above the corresponding one of the pixels; and a light-shielding section provided in a gap between adjacent ones of the pixels, or provided in an opposing region that opposes the gap when viewed in a normal direction of the wiring substrate.

In each of the substrate, the display panel, and the display apparatus according to the above-described embodiments of the present technology, the light-scattering sections are individually provided corresponding to the pixels, arranged two-dimensionally on the common wiring substrate, and are provided above the corresponding pixels. With the light-scattering sections provided in this manner, light beams emitted from the pixels are scattered, so that the dependence of the coloration on the viewing-angle is reduced. Moreover, in the above-described embodiments of the present technology, the light-shielding section is provided in the gap between the adjacent ones of the pixels or in the opposing region that opposes the gap when viewed in the normal direction of the wiring substrate. Specifically, each light-scattering section is not formed so as to pass above the corresponding pixel, and is surrounded by the light-shielding section when viewed in the normal direction of the wiring substrate. The light-shielding section provided in this manner prevents light beams emitted from the pixels from propagating inside the light-scattering sections and being output at an undesired site. Furthermore, light components contained in the light beams emitted from each pixel which diagonally propagate are blocked by the light-shielding section.

According to each of the substrate, the display panel, and the display apparatus according to the above-described embodiments of the present technology, the light-scattering sections are individually provided corresponding to the pixels, arranged two-dimensionally on the common wiring substrate, and are provided above the corresponding pixels, and the light-shielding section is provided in the gap between the adjacent ones of the pixels or in the opposing region that opposes the gap when viewed in the normal direction of the wiring substrate. This configuration successfully reduces the dependence of the coloration on the viewing-angle while suppressing blurring of an image and the reduction in a contrast of the image.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, a detailed description of the present technology will be described with reference to the accompanying drawings. The description will be given in the following order.

1. Embodiment (FIGS. 1 to 13)
2. Modifications (FIGS. 14 to 33)
3. Examples

1. EMBODIMENT

Configuration

Figure 1:
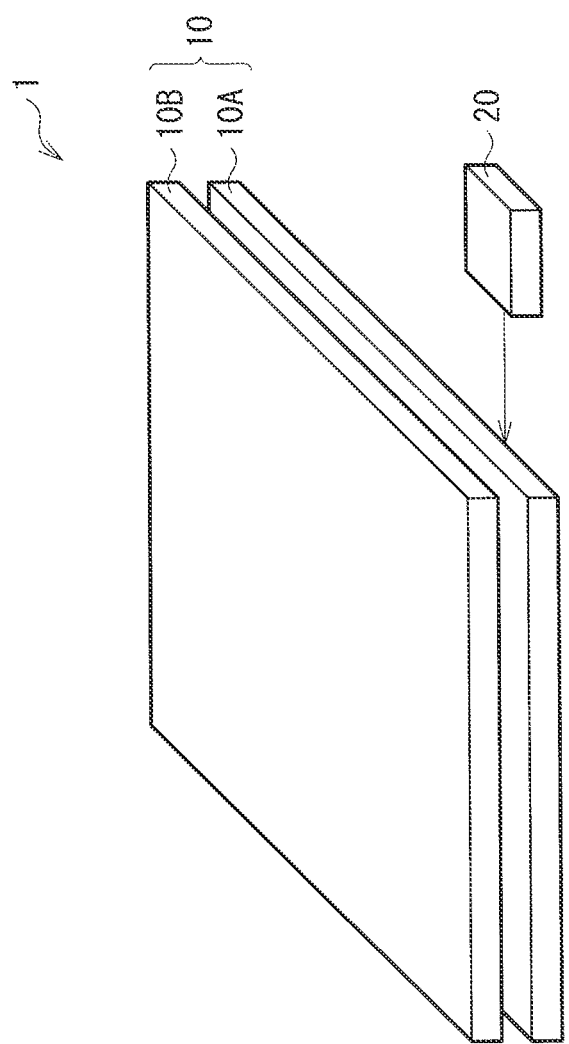
FIG. 1 is a perspective view illustrating an exemplary display apparatus according to an embodiment of the present technology.

FIG. 1 is a perspective view schematically illustrating an exemplary general configuration of a display apparatus 1 according to an embodiment of the present technology. The display apparatus 1 of this embodiment is so-called an LED display, and uses LEDs as display pixels. The display apparatus 1 includes, for example, a display panel 10 and a drive circuit 20 that drives the display panel 10 (more concretely, drives luminescent devices 40 to be described later), as illustrated in FIG. 1.

(Display Panel 10)

The display panel 10 has a structure in which a mounting substrate 10A and a counter substrate 10B are overlaid to one another. An outer surface of the counter substrate 10B acts as an image display surface, and this outer surface has a display region in a central portion thereof and a frame region, or a non-display region, around the display region.

(Mounting Substrate 10A)

Figure 2:
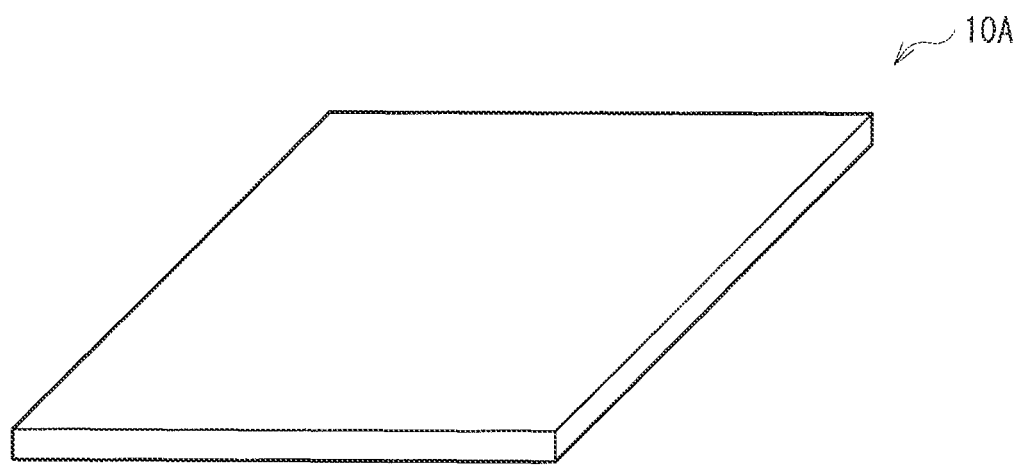
FIG. 2 is a perspective view illustrating an exemplary configuration of a mounting substrate illustrated in FIG. 1.
Figure 3:
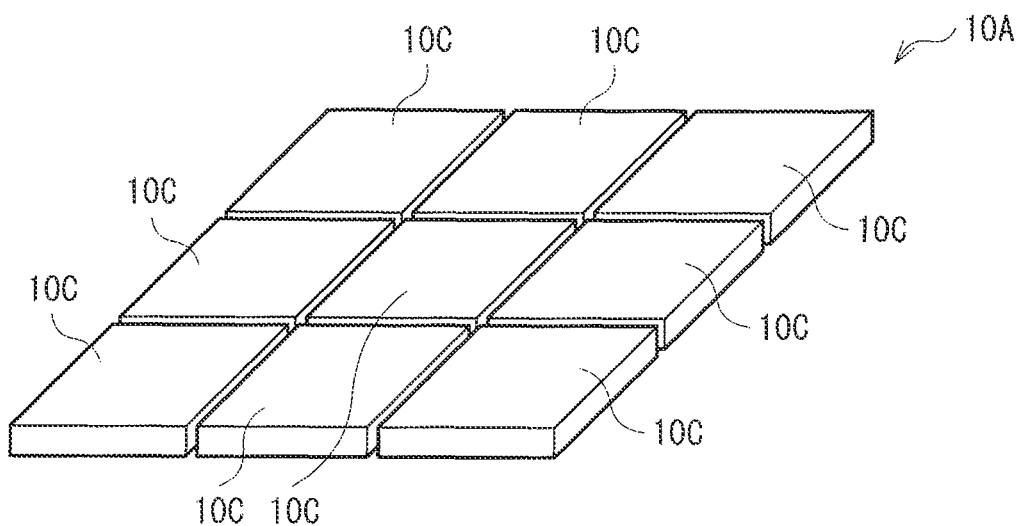
FIG. 3 is a perspective view illustrating another exemplary configuration of the mounting substrate illustrated in FIG. 1.
Figure 4:
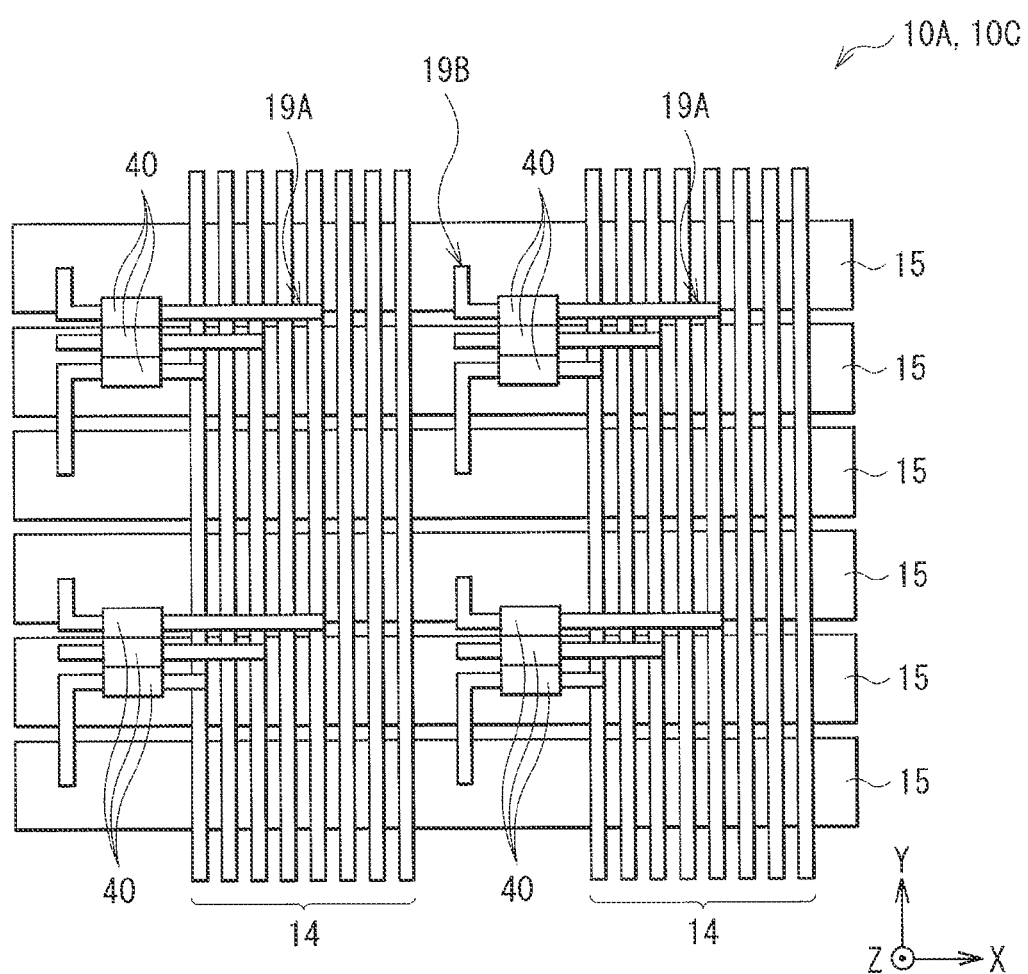
FIG. 4 is a plan view illustrating an exemplary layout design on the mounting substrate illustrated in FIGS. 2 and 3.

FIGS. 2 and 3 illustrate exemplary configurations of the mounting substrate 10A. The mounting substrate 10A may be configured of a single substrate, for example, as illustrated in FIG. 2. Alternatively, the mounting substrate 10A may be configured of a plurality of mounting substrates 10C arranged two-dimensionally, for example, as illustrated in FIG. 3. FIG. 4 illustrates an exemplary layout design in a region, corresponding to the display region, on a surface of the mounting substrate 10A (or the mounting substrate 10C) which opposes the counter substrate 10B. The mounting substrate 10A (or each mounting substrate 10C) has, for example, a plurality of Y-wires 14 and X-wires 15 in the region on the surface of the mounting substrate 10A (or each mounting substrate 10C) which corresponds to the display region. The Y-wires 14 and X-wires 15 may be formed, for example inside the mounting substrate 10A (or each mounting substrate 10C), and are not formed on a mounting surface of the mounting substrate 10A on which the luminescent devices 40 (described later) is to be mounted.

Each Y-wire 14 is a data wire which receives a signal according to an image signal from the drive circuit 20. This signal according to the image signal may be used to, for example, control an ON period (light emitting period) of the corresponding luminescent device 40. The plurality of Y-wires 14 are formed so as to extend in a predetermined direction (in a column direction in FIG. 4), and are arranged in parallel to one another at regular pitches.

Each X-wire 15 is a scan wire which receives a signal that selects the corresponding luminescent device 40 from the drive circuit 20. The signal that selects the luminescent device 40 may be used to, for example, supply a drive current to the luminescent device 40. The plurality of X-wires 15 are formed so as to extend in a direction of intersecting the Y-wires 14 (for example, at right angles) (in a row direction in FIG. 4), and are arranged in parallel to one another at regular pitches. Each of the Y-wires 14 and the X-wires 15 may be made of a conductive material, such as copper (Cu). For example, the X-wires 15 may be arranged in an underlayer of the Y-wires 14, more specifically, in a layer between a layer containing Y-wires 14 and a support substrate 11 to be described later.

The mounting substrate 10A includes the plurality of luminescent devices 40 for each display pixel. The plurality of luminescent devices 40 may be arranged, for example, in a direction parallel to the Y-wires 14 and the X-wires 15. In other words, the plurality of luminescent devices 40 may be arranged two-dimensionally within the display region. The luminescent devices 40 are electrically connected to the Y-wires 14 through conductive connection portions 19A, and to the X-wires 15 through conductive connection portions 19B, respectively.

Figure 5:
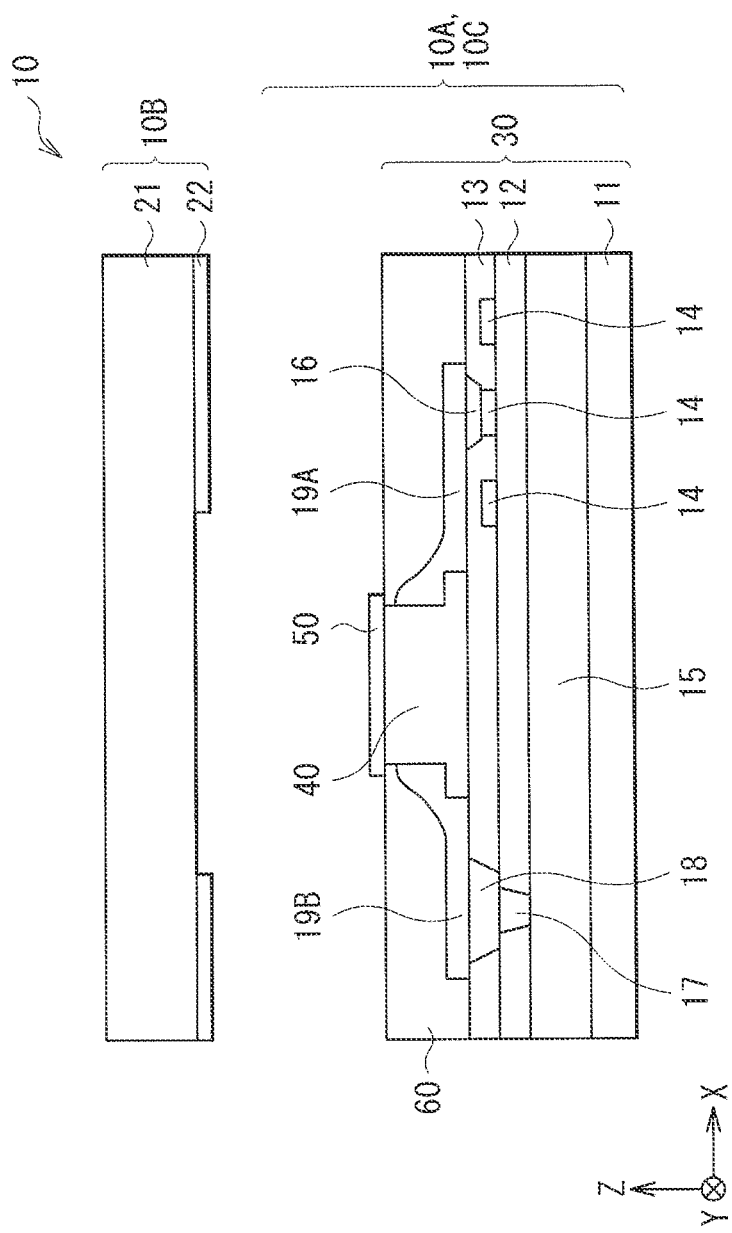
FIG. 5 is a view illustrating an exemplary cross-sectional configuration of the display apparatus illustrated in FIG. 1.
Figure 6:
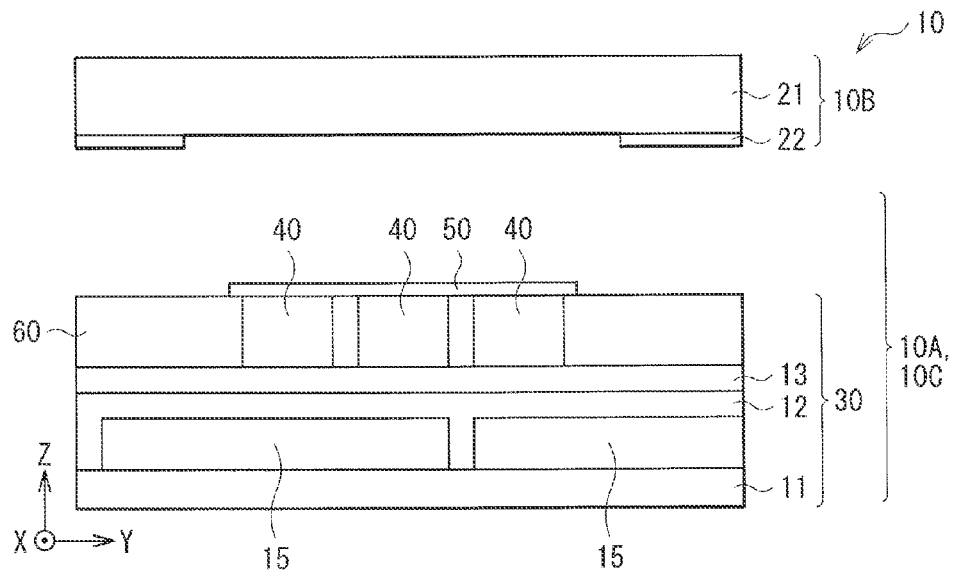
FIG. 6 is a view illustrating another exemplary cross-sectional configuration of the display apparatus illustrated in FIG. 5.
Figure 7:
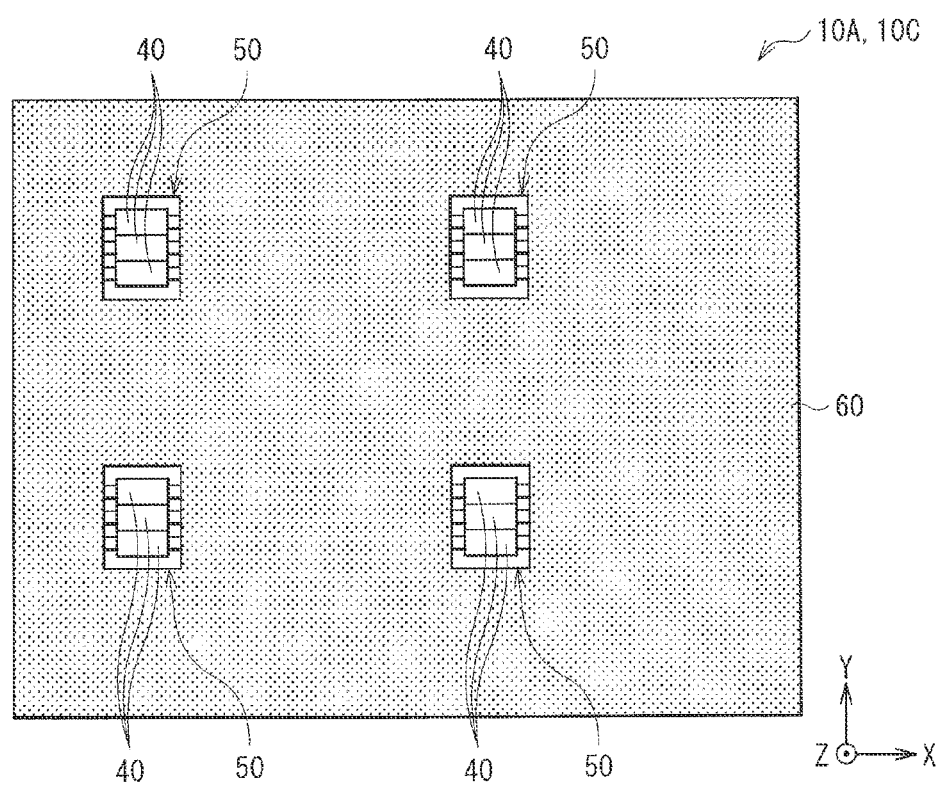
FIG. 7 is a plan view illustrating another exemplary layout design on the mounting substrate illustrated in FIGS. 2 and 3.

FIGS. 5 and 6 each illustrate an exemplary cross-sectional configuration of the display panel 10. Specifically, FIGS. 5 and 6 illustrate the exemplary cross-sectional configurations of the display panel 10 when the display panel 10 is cut in directions parallel to X-axial and Y-axial directions, respectively. FIG. 7 illustrates an exemplary configuration of an upper surface of the mounting substrate 10A (or each mounting substrate 10C).

The mounting substrate 10A has a structure, for example, in which the plurality of luminescent devices 40 are mounted on a common wiring substrate 30, for example, as illustrated in FIG. 5 or 6. The wiring substrate 30 may be configured by stacking an interlayer insulating film 12 and an interlayer insulating film 13 on the support substrate 11, in this order. The support substrate 11 may be, for example, a glass or resin substrate. Each of the interlayer insulating layers 12 and 13 may be made of, for example, SiN, $SiO_2$, or $Al_2O_3$. The interlayer insulating film 13 constitutes an outermost surface of the support substrate 11, and the Y-wires 14 may be formed in the same layer as the interlayer insulating film 13, or the outermost surface. In this case, each Y-wire 14 is electrically connected to the corresponding connection portion 19A through the conductive connection portion 16 formed in the same layer as the interlayer insulating film 13. Meanwhile, the X-wires 15 may be formed, for example, in a layer between the support substrate 11 and the interlayer insulating film 13, and for example, in the same layer as the interlayer insulating film 12. In this case, each X-wire 15 may be electrically connected to the corresponding connection portion 19B through the conductive connection portions 17 and 18, which are formed in the same layers as that of the interlayer insulating layers 12 and 13, respectively.

The mounting substrate 10A further includes a plurality of light-scattering sections 50, each of which is provided for each of the display pixels and above a luminescent device group (including the plurality of luminescent devices 40) that corresponds to each display pixel, for example, as illustrated in FIGS. 5 to 7. The light-scattering sections 50 are formed in contact with upper surfaces of the display pixels, and are arranged at regular intervals while not making contact with one another. In more detail, each of the light-scattering sections 50 is not formed so as to traverse the adjacent display pixels, and the respective light-scattering sections 50 above the adjacent display pixels are spatially separated from one another. Each light-scattering section 50 has substantially the same size as the upper surface of each display pixel has.

The mounting substrate 10A further includes a light-shielding section 60 provided in a gap between the adjacent display pixels, for example, as illustrated in FIGS. 5 to 7. The light-shielding section 60 is formed so as to entirely cover the gap between the adjacent display pixels when viewed in a normal direction of the wiring substrate 30. The light-shielding section 60 is formed in contact with side surfaces of the display pixels. Accordingly, each light-scattering section 50 is surrounded by the light-shielding section 60 when viewed in the normal direction of the wiring substrate 30. The light-shielding section 60 has uncovered, exposed regions on the upper surface thereof which are formed by the light-scattering sections 50. The exposed regions of the light-shielding section 60 are present in the gap between the adjacent light-scattering sections 50. In this case, for example, the light-shielding section 60 may be provided in a gap between the adjacent luminescent devices 40, in addition to the gap between the adjacent display pixels. For example, the light-scattering sections 50 may be formed after the formation of the light-shielding section 60, in which case respective ends of the light-scattering sections 50 may make contact with the upper surface of the light-shielding section 60.

Figure 8:
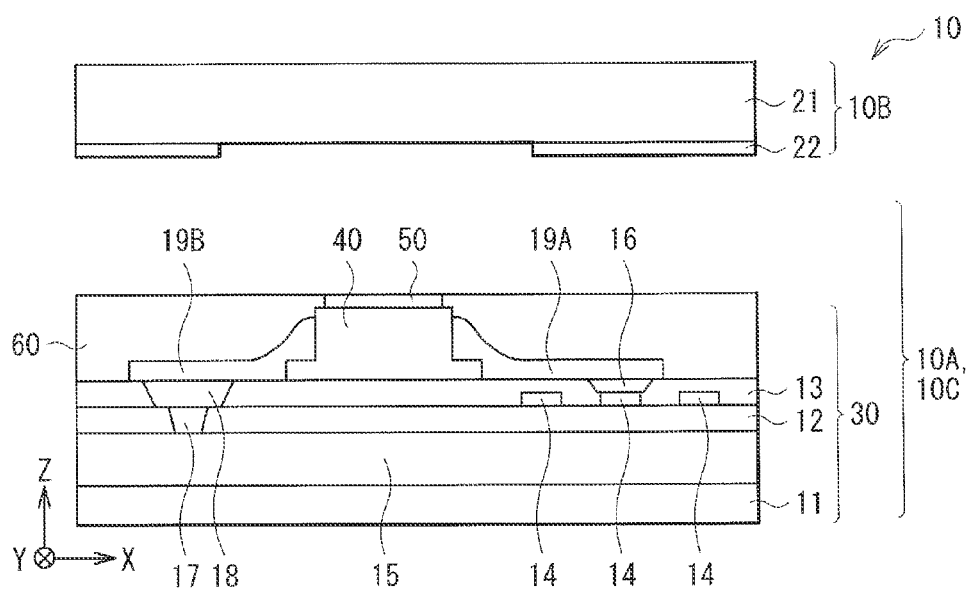
FIG. 8 is a view illustrating a first modification of the cross-sectional configuration of the display apparatus illustrated in FIG. 1.
Figure 9:
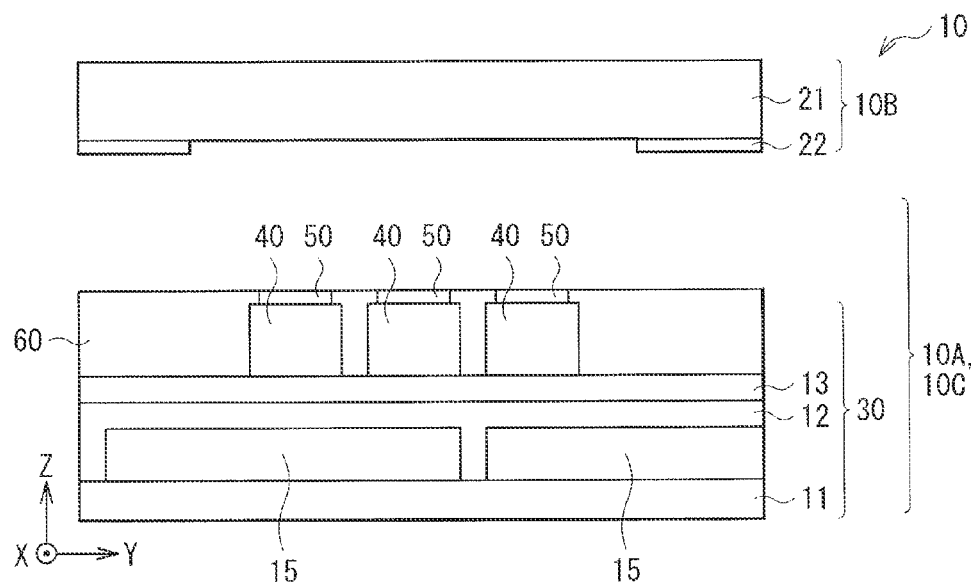
FIG. 9 is a view illustrating another exemplary cross-sectional configuration of the display apparatus illustrated in FIG. 8.

Alternatively, each of the light-scattering sections 50 may be provided for a corresponding one of the luminescent devices 40 and above the corresponding luminescent device 40, for example, as illustrated in FIGS. 8 and 9. In this case, the light-scattering section 50 may have substantially the same size as or a slightly smaller size than the upper surface of the luminescent device 40 has. In addition, for example, the light-shielding section 60 may be formed after the formation of the light-scattering section 50, in which case respective ends (or respective end surfaces) of the light-scattering sections 50 may be embedded in the light-shielding section 60.

In each display pixel, the light-scattering section 50 scatters a light beam emitted from the luminescent device 40 or light beams emitted from the luminescent devices 40. As a result, the dependence of the coloration of the light beams emitted from the display pixels on the viewing-angle is reduced. For example, each light-scattering section 50 may have a haze value of more than 0, and be somewhat whitish. In addition, in each display pixel, the light-scattering section 50 makes contact with the upper surface of the luminescent device 40 or the upper surfaces of the luminescent devices 40. Each light-scattering section 50 may be formed by, for example, hardening paint in which a plurality of scattering substances are dispersed in a binder. Further, the binder may be made of, for example, a material containing silicone as a main ingredient, and each scattering substance may be made of, for example, a titanium oxide.

The light-shielding section 60, as described above, suppresses the light beams emitted from the luminescent devices 40 in each of the display pixels from entering other ones of the display pixels. For example, the light-shielding section 60 may be made of a material that absorbs the light beam emitted from each luminescent device 40. Concretely, the light-shielding section 60 may be formed by, for example, hardening paint in which carbon is dispersed in silicone.

(Opposing Substrate 10B)

The counter substrate 10B is disposed at an opposing site to the wiring substrate 30 with a predetermined space therebetween. The counter substrate 10B may include, for example, the support substrate 21, and a black matrix 22 formed on a surface of the support substrate 21 which is closer to the mounting substrate 10A, as illustrated in FIG. 5. The black matrix 22 is provided in an opposing region, which opposes the gap between the adjacent display pixels when viewed in the normal direction of the wiring substrate 30. The support substrate 21 is a light-transmitting substrate, which allows the light beams emitted from the luminescent devices 40 to pass therethrough, and may be made of, for example, a glass or transparent resin substrate. The black matrix 22 absorbs the light beams emitted from the luminescent devices 40, and may be formed by, for example, hardening paint in which carbon is dispersed in silicone.

Next, an internal configuration of the luminescent device 40 will be described. The luminescent device 40 may be, for example, an LED chip. This LED chip may have a chip size of, for example, micrometer order, such as 10 μm per side. The LED chip may include: for example, a semiconductor layer that has a stacked structure in which an active layer is sandwiched between semiconductor layers of opposite conductive types; and two electrodes that are arranged in a plane common to the semiconductor layer (in the same plane as the semiconductor layer). One of the electrodes is electrically connected to the semiconductor layer of one conductive type in the semiconductor layer of the luminescent device 40; the other of the electrodes is electrically connected to the semiconductor layer of the other conductive type in the semiconductor layer of the luminescent device 40. In this case, all the luminescent devices 40 may have the same structure. Alternatively, the structures of all the luminescent devices 40 may differ, depending on their emission colors.

The single luminescent device group that corresponds to a display pixel includes the plurality of types of luminescent device 40 that emit light beams of different colors. For example, the luminescent device group may include the luminescent device 40 that emits a red light beam, the luminescent device 40 that emits a green light beam, and the luminescent device 40 that emits a blue light beam, in which case each display pixel emits light beams of three primary colors. Alternatively, the luminescent device group may include the luminescent device 40 that emits a red light beam, the luminescent device 40 that emits a green light beam, the luminescent device 40 that emits a blue light beam, and the luminescent device 40 that emits a cyan, magenta, or white light beam, in which case each display pixel emits light beams of four colors.

Figure 10:
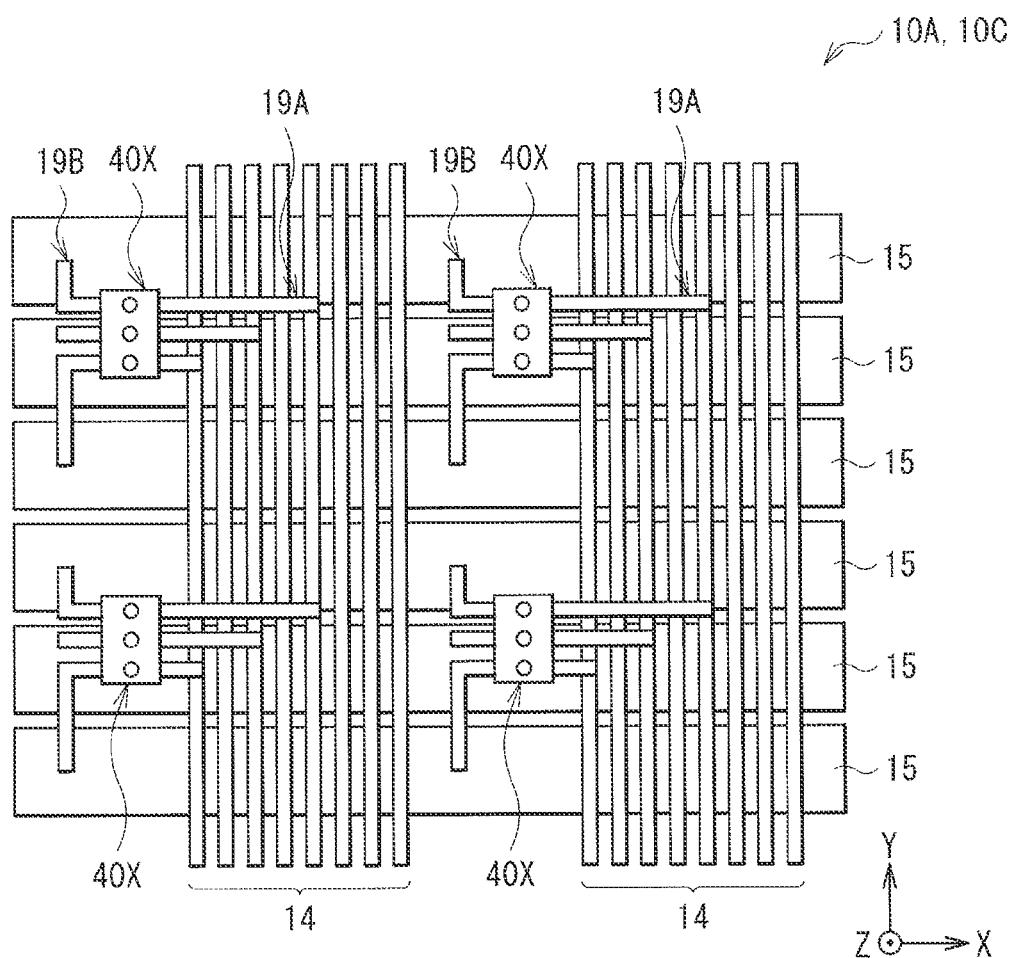
FIG. 10 is a plan view illustrating a modification of a layout design on the mounting substrate illustrated in FIG. 1.
Figure 11:
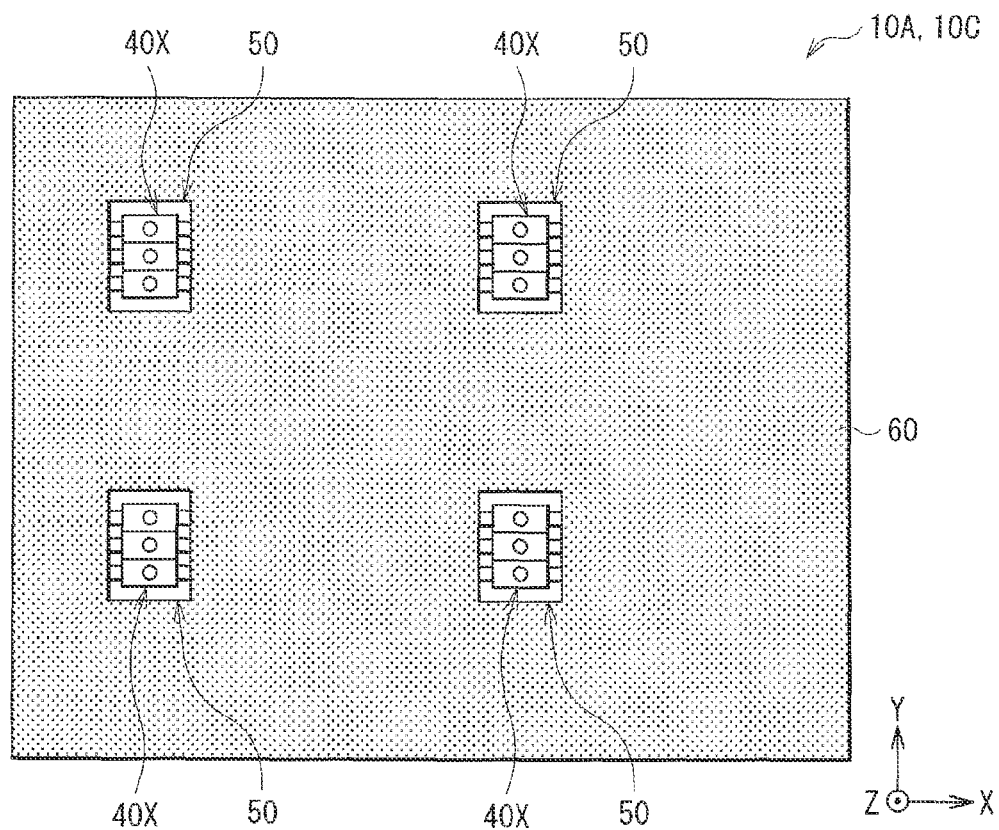
FIG. 11 is a plan view illustrating another modification of the layout design on the mounting substrate illustrated in FIG. 1.
Figure 12:
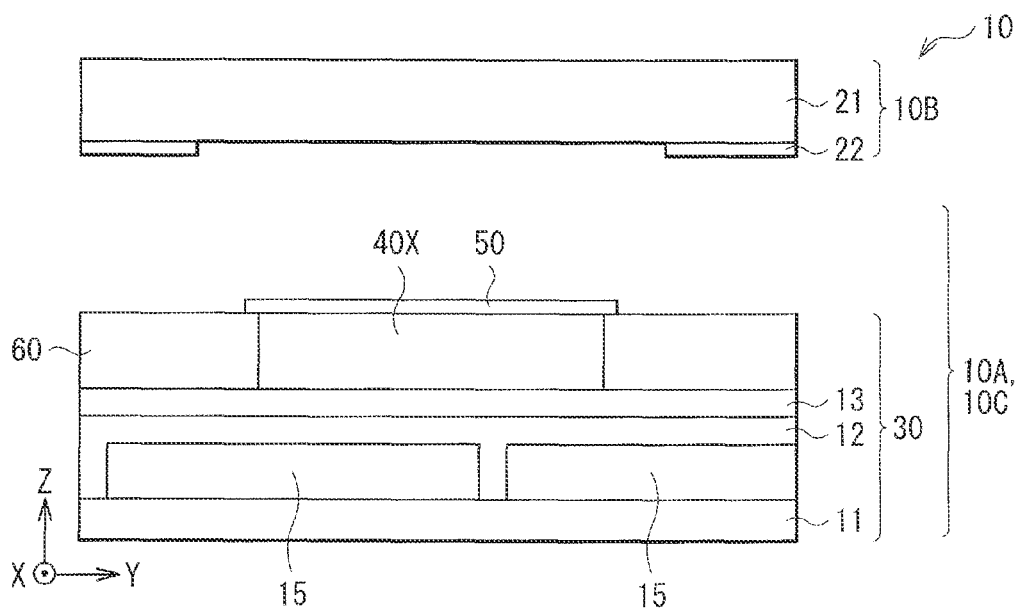
FIG. 12 is a view illustrating a second modification of the cross-sectional configuration of the display apparatus illustrated in FIG. 1.

For example, the plurality of luminescent devices 40 included in the above luminescent device group may be mounted on an element substrate and be fixed thereto with an insulating resin, in which case this luminescent device group serves as a luminescent device 40X that emits light beams of multiple colors, for example, as illustrated in FIG. 10. Here, each of the light-scattering sections 50 is provided for a corresponding one of the luminescent devices 40X and above the corresponding luminescent device 40X. The light-scattering sections 50 are arranged adjacent to one another with a predetermined gap therebetween, without making contact with one another. In other words, each of the light-scattering sections 50 is not formed so as to traverse the adjacent luminescent devices 40X, and the respective light-scattering sections 50 above the adjacent luminescent devices 40X are spatially separated from another one. Each light-scattering section 50 may have substantially the same size as the upper surface of each display pixel has, for example, as illustrated in FIGS. 11 and 12. For example, the light-scattering sections 50 may be formed after the formation of the light-shielding section 60, in which case respective ends of the light-scattering sections 50 may make contact with the upper surface of the light-shielding section 60.

Figure 13:
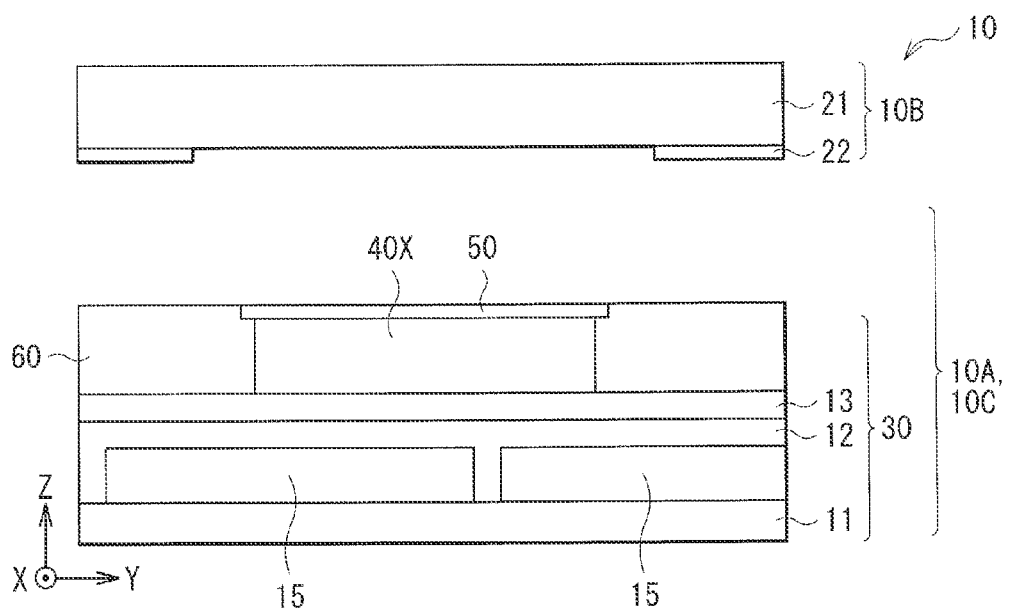
FIG. 13 is a view illustrating a third modification of the cross-sectional configuration of the display apparatus illustrated in FIG. 1.

Alternatively, each light-scattering section 50 may have the same size at or slightly smaller than the upper surface of each luminescent device 40, for example, as illustrated in FIG. 13. For example, the light-shielding section 60 may be formed after the formation of the light-scattering sections 50, in which case respective ends (or respective end surfaces) of the light-scattering sections 50 may be embedded in the light-shielding section 60.

(Manufacture Method)

Next, a description will be given of an exemplary method of manufacturing the mounting substrate 10A (or each mounting substrate 10C). First, a substrate is prepared, in which the plurality of display pixels are arranged two-dimensionally on the common wiring substrate 30. Each of display pixels includes the plurality of types of luminescent devices 40 that emit light beams of different colors. Then, the light-shielding section 60 is formed in the gap between the adjacent display pixels which is located on a surface of the above substrate. Followed by, the lightscattering sections 50 are individually formed above the corresponding display pixels. For example, each light-scattering section 50 may be formed so as to make contact with the upper surface of the corresponding display pixel. Through the above processing, the mounting substrate 10A (or each mounting substrate 10C) may be manufactured.

Furthermore, the following method may also be adopted to manufacture the mounting substrate 10A (or each mounting substrate 10C). First, a substrate is prepared, in which the plurality of display pixels are arranged two-dimensionally on the common wiring substrate 30. Each of display pixels includes the plurality of types of luminescent device 40 that emit light beams of different colors. Then, the light-scattering sections 50 are individually formed above the corresponding display pixels. For example, each light-scattering section 50 may be formed so as to make contact with the upper surface of the corresponding display pixel. Followed by, the light-shielding section 60 is formed in the gap between the adjacent display pixels which is located on a surface of the above substrate. Through the above processing, the mounting substrate 10A (or each mounting substrate 10C) may be manufactured.

(Function and Effect)

Next, a function and effect of the display apparatus 1 will be described below. In the display apparatus 1 of the present embodiment, the light-scattering sections 50 are individually provided corresponding to the display pixels, arranged two-dimensionally on the common wiring substrate 30, and are provided above the corresponding display pixels. With the light-scattering sections 50 provided in this manner, the light beams emitted from each display pixel are scattered, so that the dependence of the coloration on the viewing-angle is reduced. Furthermore, in the present embodiment, the light-shielding section 60 is provided in the gap between the adjacent display pixels, and the black matrix 22 may be provided in the opposing region that opposes the gap between the adjacent display pixels when viewed in the normal direction of the wiring substrate 30. In other words, each light-scattering section 50 is not formed so as to pass above the corresponding display pixel, and each of the light-scattering sections 50 is surrounded by the light-shielding section 60 and the black matrix 22 when viewed in the normal direction of the wiring substrate 30. This arrangement prevents the light beams emitted from each display pixel from propagating inside the light-scattering section 50 and being output at an undesired site. In addition, light components contained in the light beams emitted from each display pixel which diagonally propagate are blocked by the light-shielding section 60 and the black matrix 22. Consequently, the dependence of the coloration on the viewing-angle is reduced, and blurring of an image and the reduction in a contrast of the image are suppressed.

In the present embodiment, note that the dependence of the coloration on the viewing-angle is reduced due to the effect produced by the light-scattering section 50. Therefore, it is possible to reduce the dependence of the coloration on the viewing-angle more readily and reliably than a case of utilizing a tiling technique, an optical compensation film, or some other similar technique or member.

2. MODIFICATIONS

Modification 1

Figure 14:
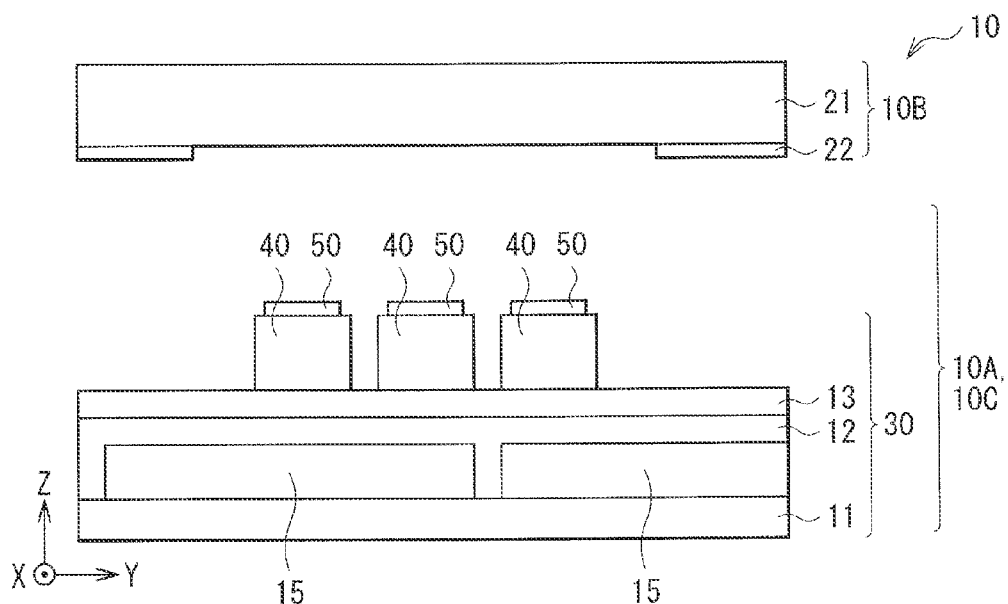
FIG. 14 is a view illustrating a fourth modification of the cross-sectional configuration of the display apparatus illustrated in FIG. 1.
Figure 15:
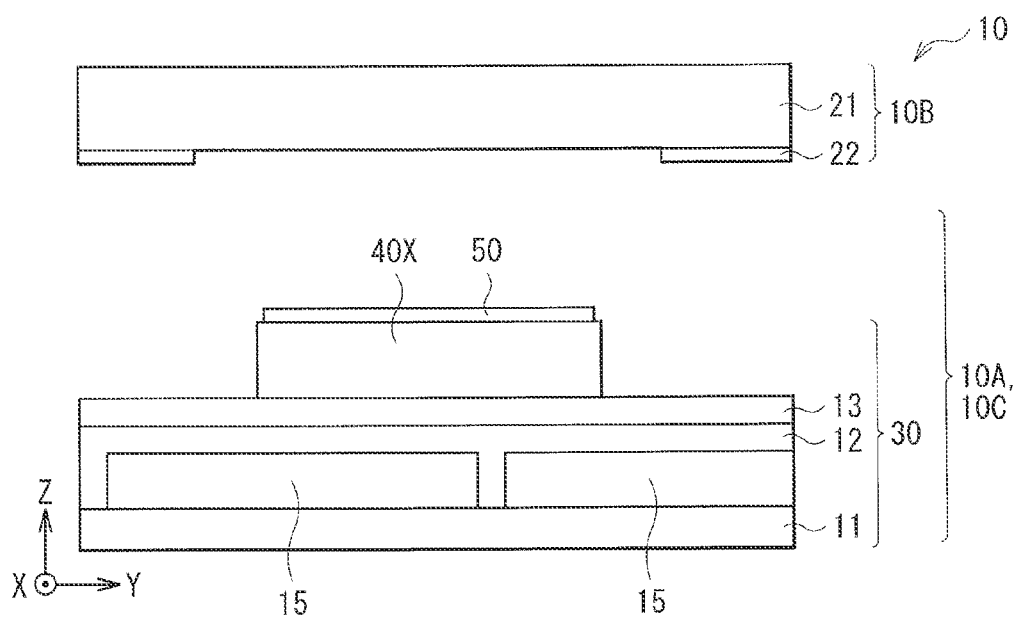
FIG. 15 is a view illustrating a fifth modification of the cross-sectional configuration of the display apparatus illustrated in FIG. 1.

In the above embodiment, the light-shielding section 60 may be omitted, for example, as illustrated in FIGS. 14 and 15. Even in this case, light components contained in the light beams emitted from each display pixel which diagonally propagate are blocked by the black matrix 22. Consequently, this configuration also successfully reduces the dependence of the coloration on the viewing-angle, while suppressing blurring of an image.

Modification 2

Figure 16:
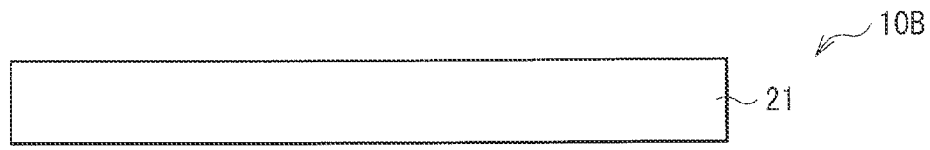
FIG. 16 is a view illustrating a first modification of a cross-sectional configuration of a counter substrate in the display apparatus illustrated in FIGS. 6 to 9 and 12 to 15.

The above embodiment, the black matrix 22 may be omitted, for example, as illustrated in FIG. 16. Even in this case, light components contained in the light beam emitted from each display pixel which diagonally propagate are blocked by the light-shielding section 60. Consequently, this configuration also successfully reduces the dependence of the coloration on the viewing-angle white suppressing blurring of an image, Modification 3

Figure 17:
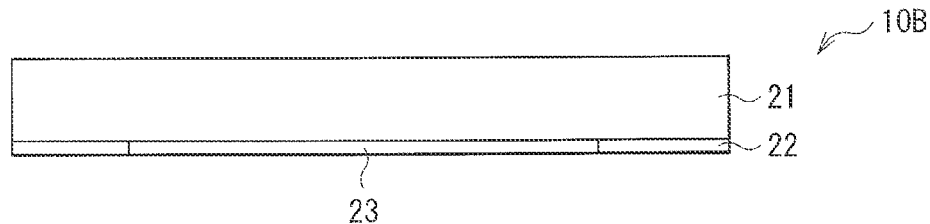
FIG. 17 is a view illustrating a second modification of the cross-sectional configuration of the counter substrate in the display apparatus illustrated in FIGS. 6 to 9 and 12 to 15.

In the above embodiment, a color filter 23 may be provided on a surface of the support substrate 21 which is closer to the wiring substrate 30, in addition to the black matrix 22, for example, as illustrated FIG. 17. The color filter 23 is supported by the support substrate 21, and is formed above the display pixels. The color filter 23 selectively transmits light beams having the same colors as those of the light beams emitted from the luminescent device 40 that is located below the color filter 23 itself. Accordingly, the color filter 23 blocks the light beams emitted from another adjacent luminescent device 40. Consequently, providing the color filter 23 further suppresses blurring of the image.

Modification 4

Figure 18:
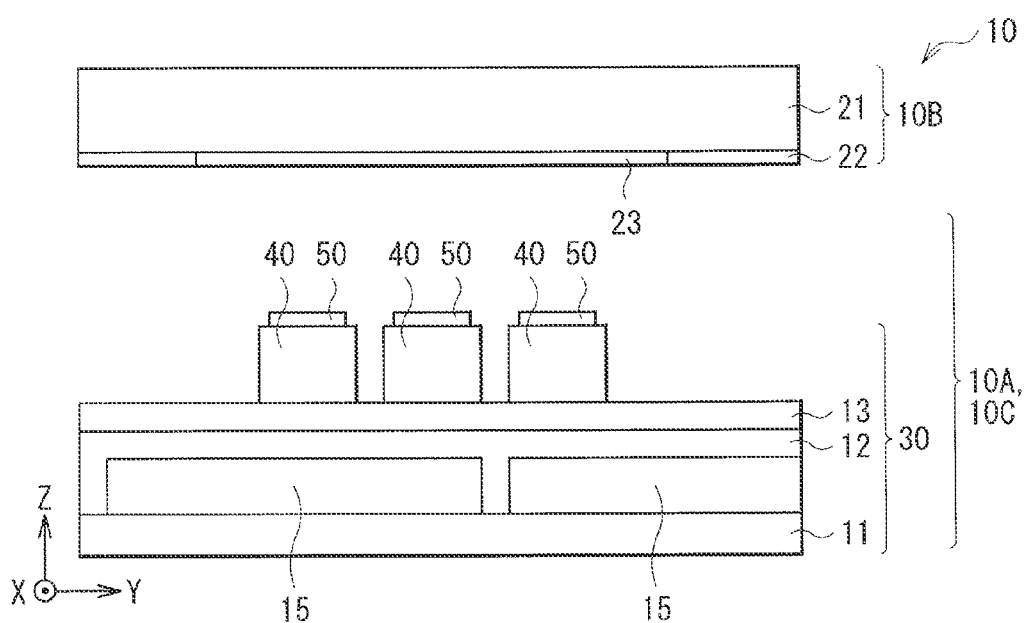
FIG. 18 is a view illustrating a sixth modification of the cross-sectional on of the display apparatus illustrated in FIG. 1.
Figure 19:
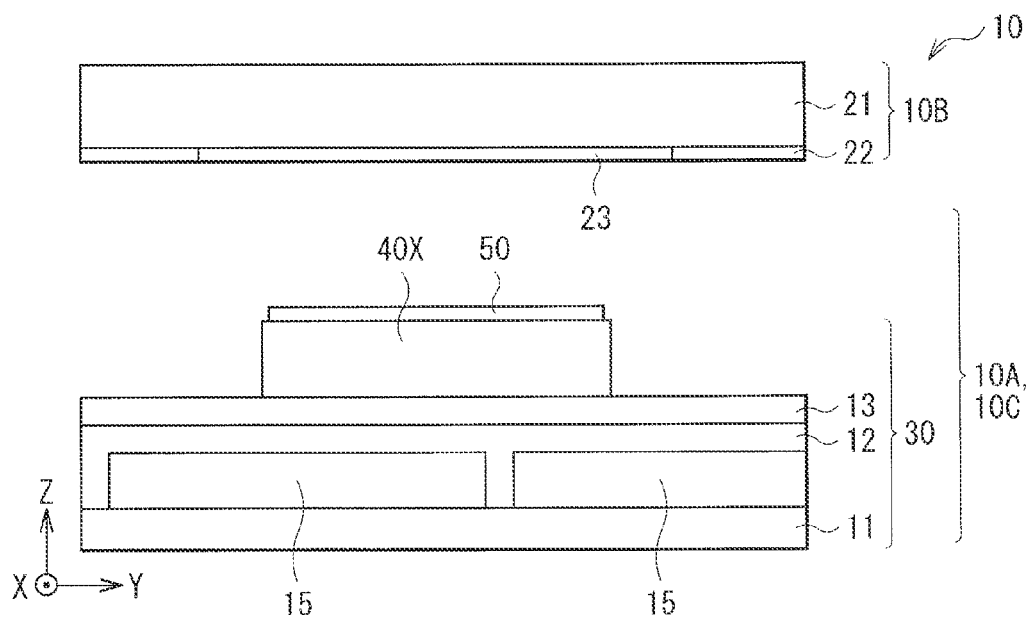
FIG. 19 is a view illustrating a seventh modification of the configuration of the cross section of the display apparatus illustrated in FIG. 1.
Figure 20:
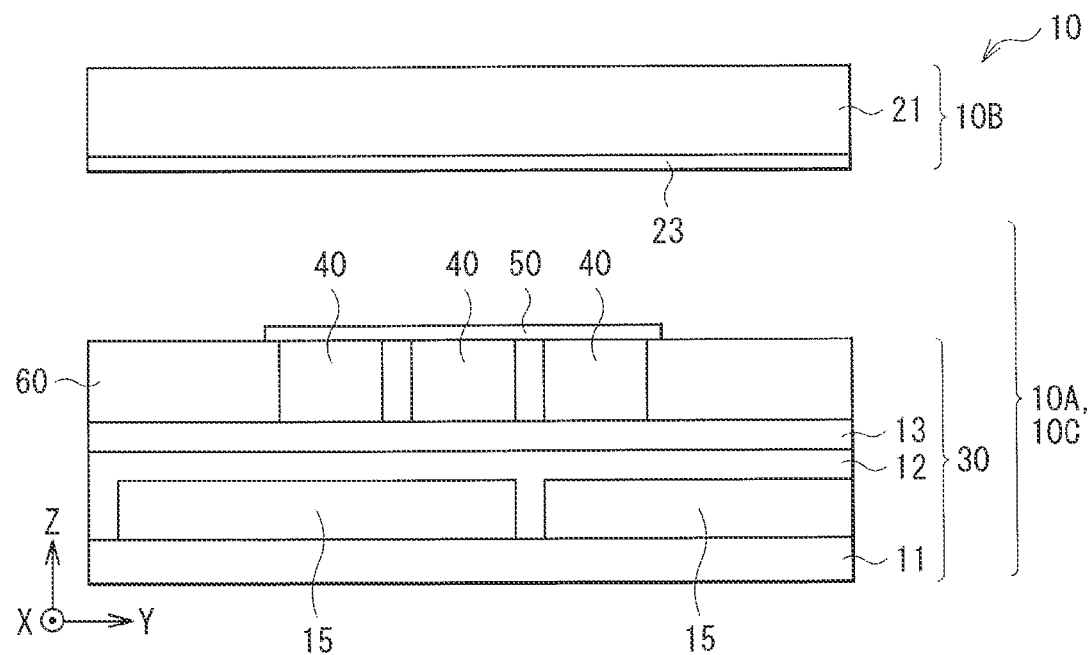
FIG. 20 is a view illustrating an eighth modification of the cross-sectional configuration of the display apparatus illustrated in FIG. 1.
Figure 21:
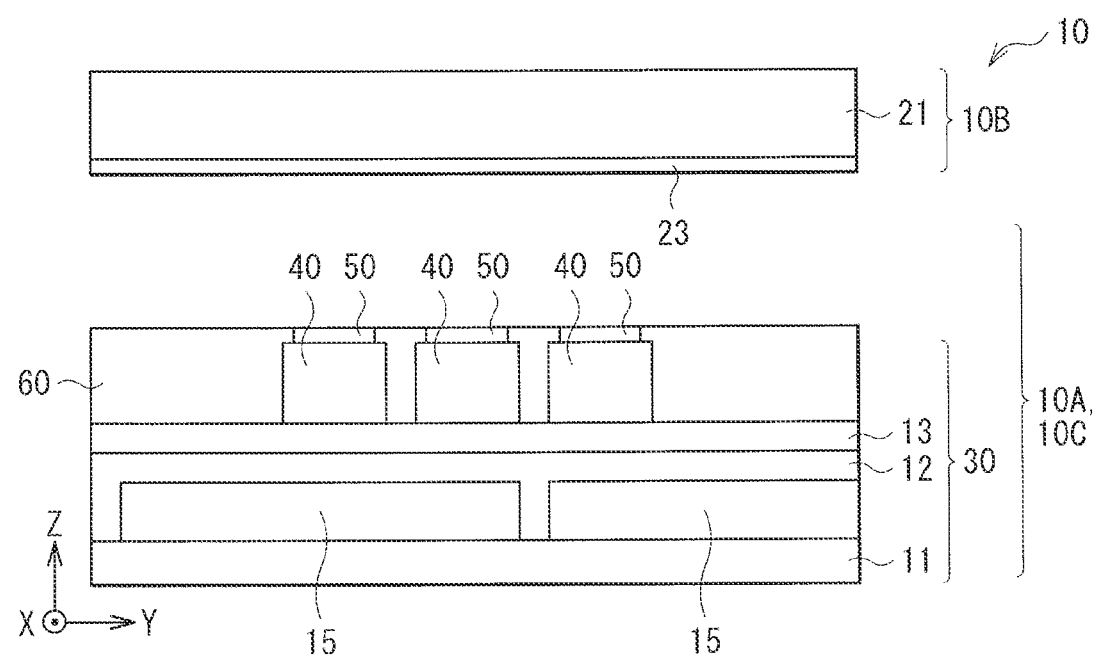
FIG. 21 is a view illustrating a ninth modification of the cross-sectional configuration of the display apparatus illustrated in FIG. 1.
Figure 22:
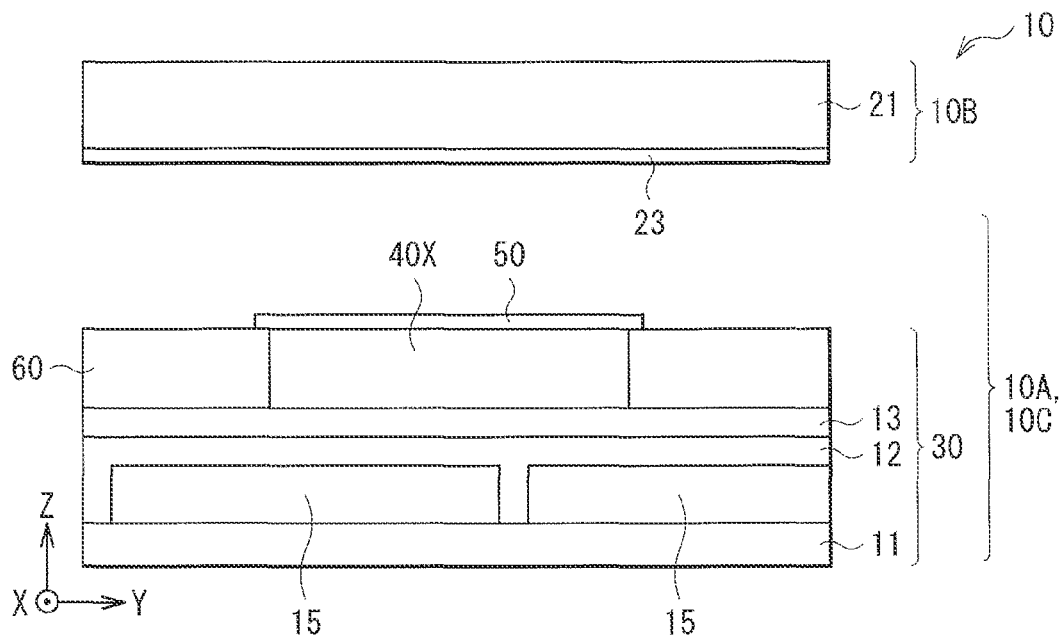
FIG. 22 is a view illustrating a tenth modification of the cross-sectional configuration of the display apparatus illustrated in FIG. 1.
Figure 23:
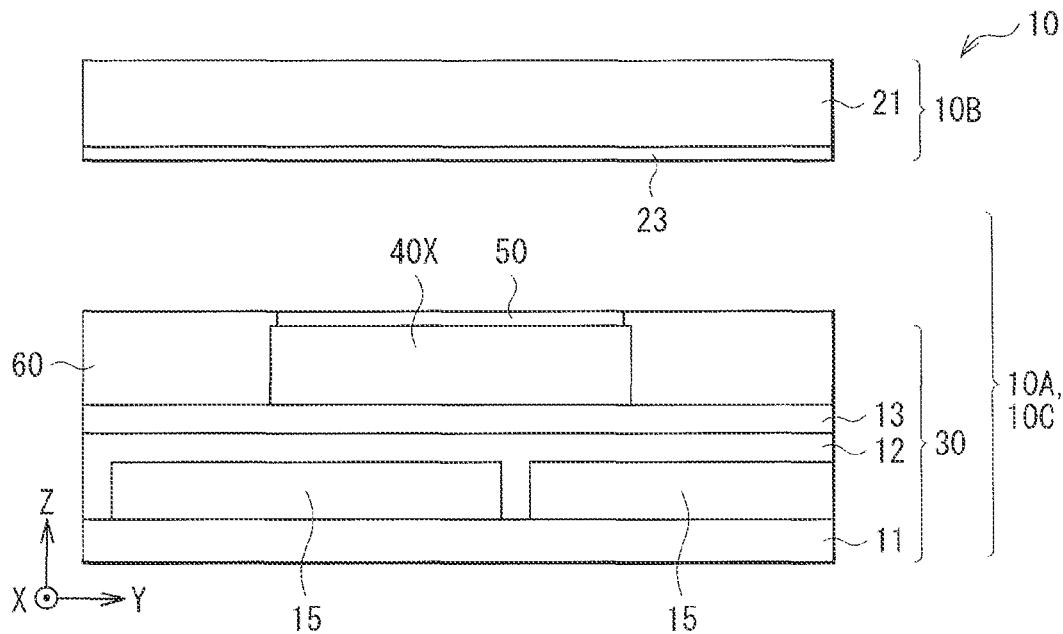
FIG. 23 is a view illustrating an eleventh modification of the cross-sectional configuration of the display apparatus illustrated in FIG. 1.

In the above modification 3, the light-shielding section 60 may be omitted, for example, as illustrated in FIGS. 18 and 19. Even in this case, light components contained in the light beams emitted from each display pixel which diagonally propagate are blocked by the black matrix 22. Consequently, this configuration also successfully reduces the dependence of the coloration on the viewing-angle, and suppresses blurring of an image.

Modification 5

In the above modification 2, the color filter 23 may be provided on a surface of the support substrate 21 which is closer to the wiring substrate 30, for example, as illustrated in FIGS. 20 to 23. In this case, the color filter 23 may be provided on the overall surface of the support substrate 21 which is closer to the wiring substrate 30. This configuration successfully further suppresses blurring of an image, by virtue of the effect produced by the color filter 23.

Modification 6

Figure 24:
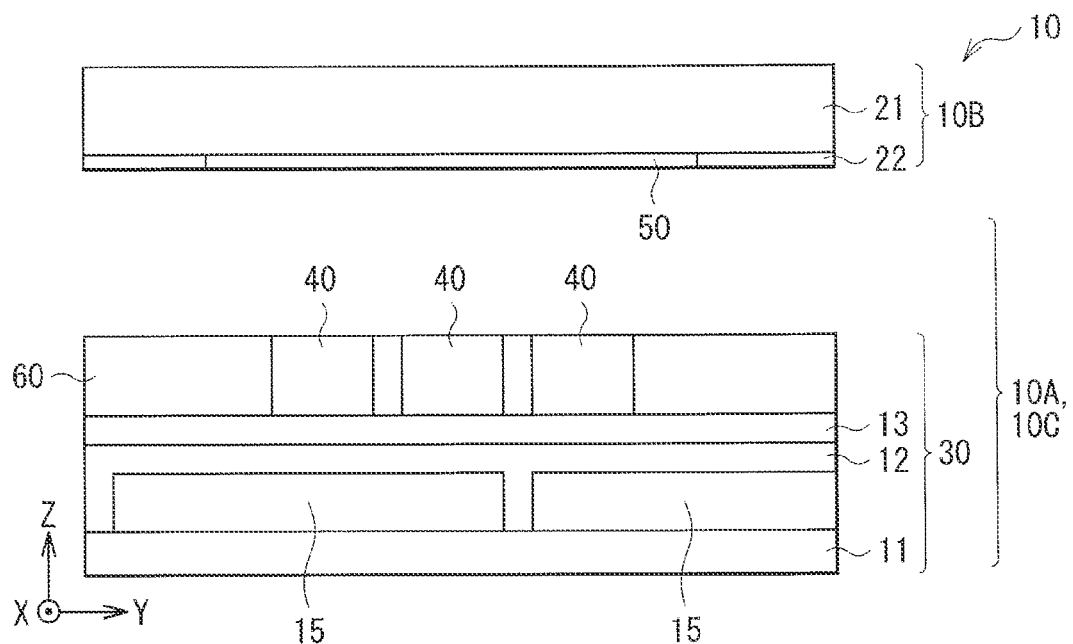
FIG. 24 is a view illustrating a twelfth modification of the cross-sectional configuration of the display apparatus illustrated in FIG. 1.
Figure 25:
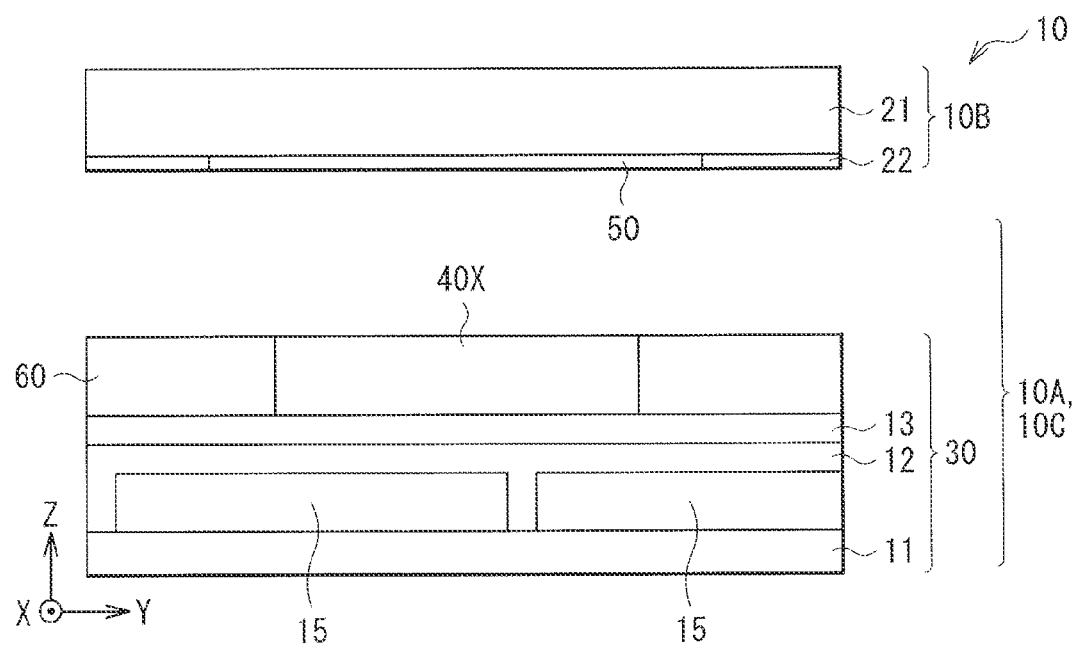
FIG. 25 is a view illustrating a thirteenth modification of the cross-sectional configuration of the display apparatus illustrated in FIG. 1.
Figure 26:
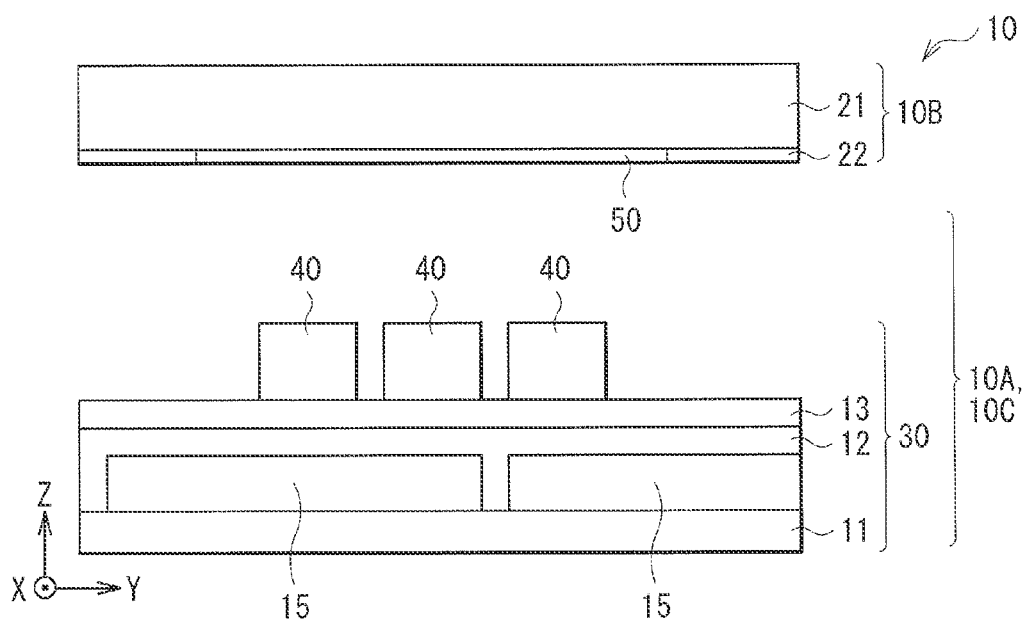
FIG. 26 is a view illustrating a fourteenth modification of the cross-sectional configuration of the display apparatus illustrated in FIG. 1.
Figure 27:
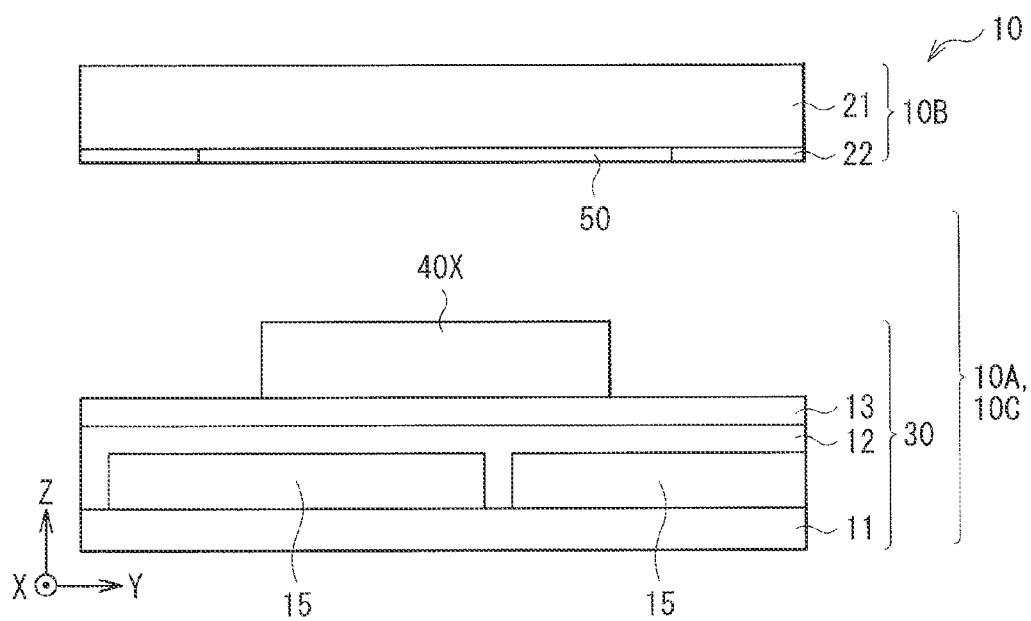
FIG. 27 is a view illustrating a fifteenth modification of the cross-sectional configuration of the display apparatus illustrated in FIG. 1.
Figure 28:
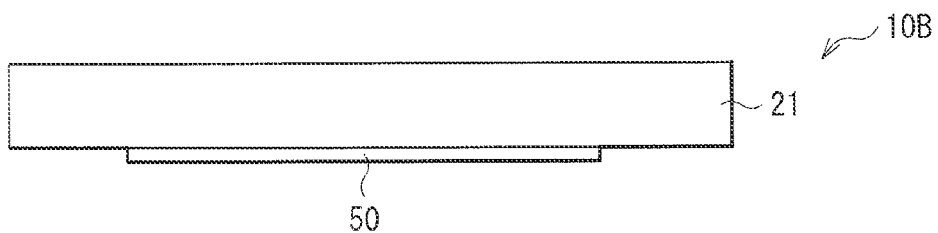
FIG. 28 is a view illustrating a first modification of the cross-sectional configuration of the counter substrate in the display apparatus illustrated in FIGS. 24 to 27.
Figure 29:
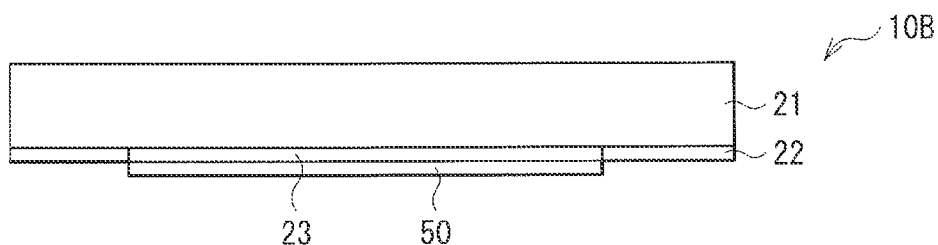
FIG. 29 is a view illustrating a second modification of the cross-sectional configuration of the counter substrate in the display apparatus illustrated in FIGS. 24 to 27.
Figure 30:
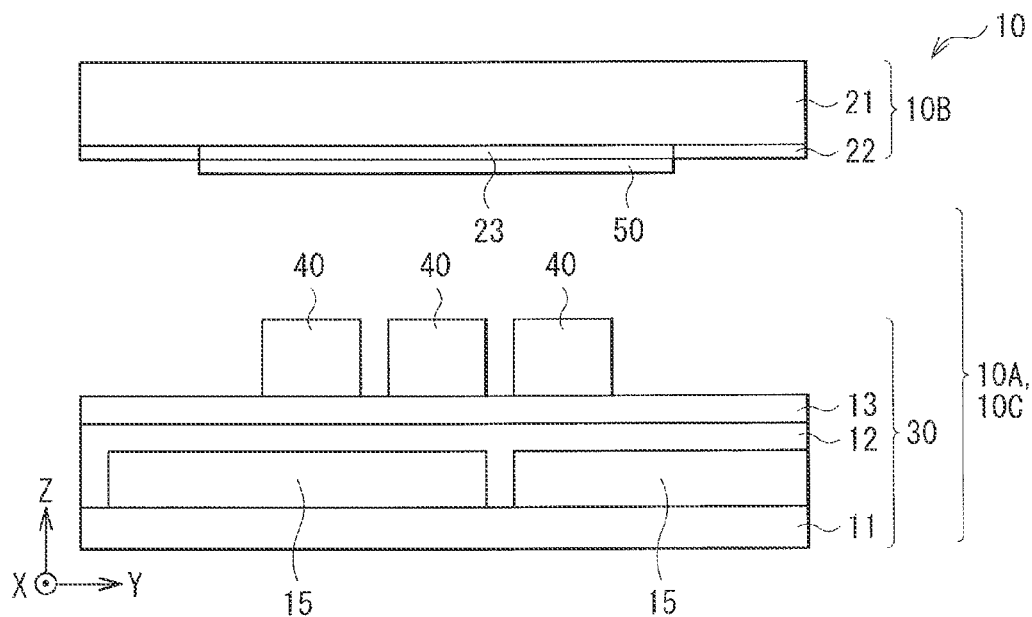
FIG. 30 is a view illustrating a sixteenth modification of the cross-sectional configuration of the display apparatus illustrated in FIG. 1.
Figure 31:
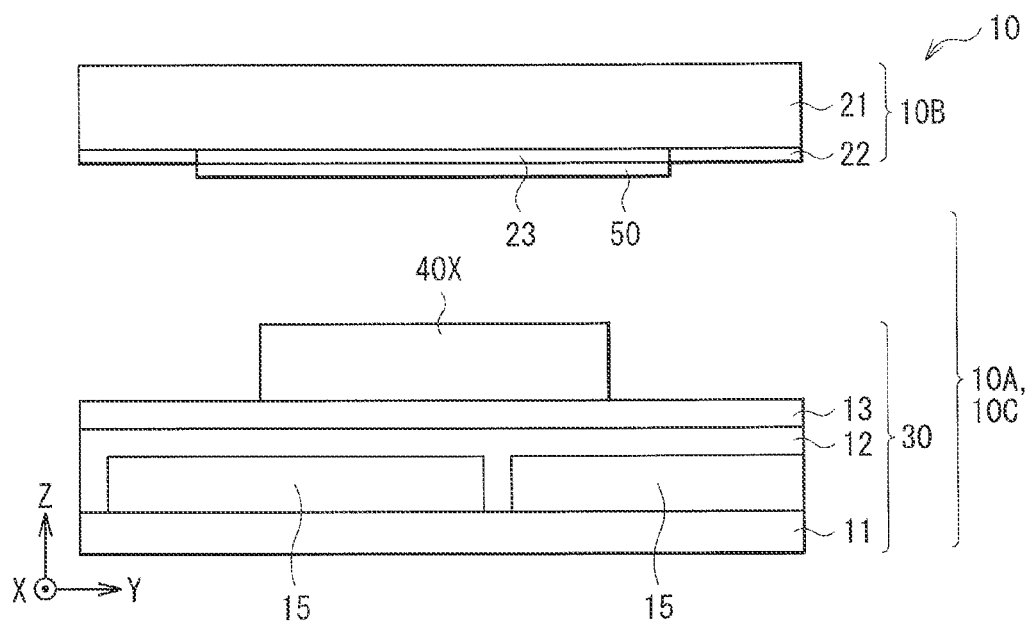
FIG. 31 is a view illustrating a seventeenth modification of the cross-sectional configuration of the display apparatus illustrated in FIG. 1.
Figure 32:
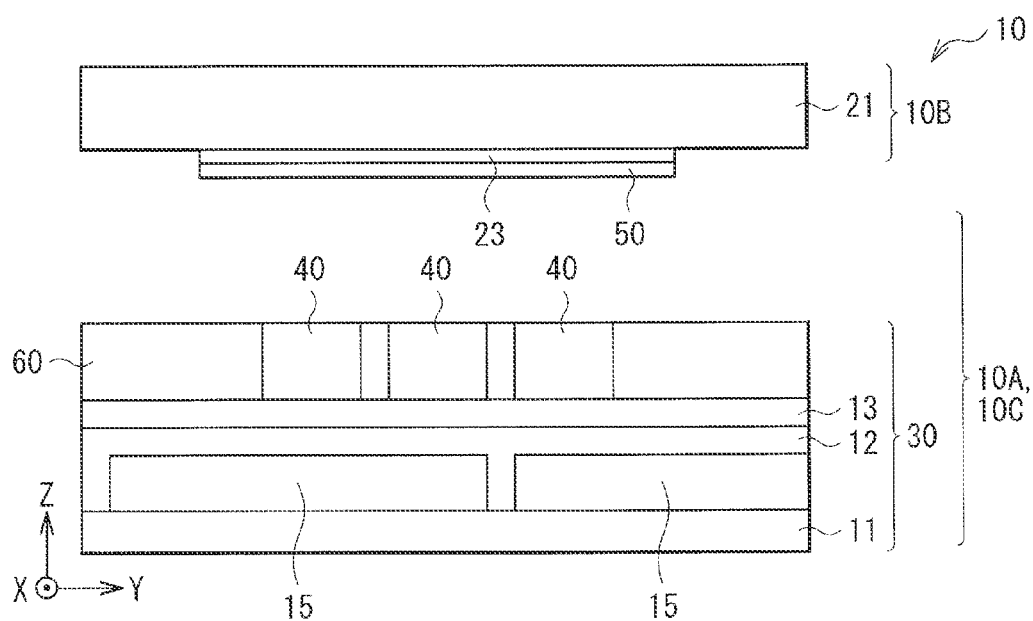
FIG. 32 is a view illustrating an eighteenth modification of the cross-sectional configuration of the display apparatus illustrated in FIG. 1.
Figures 33, 34:
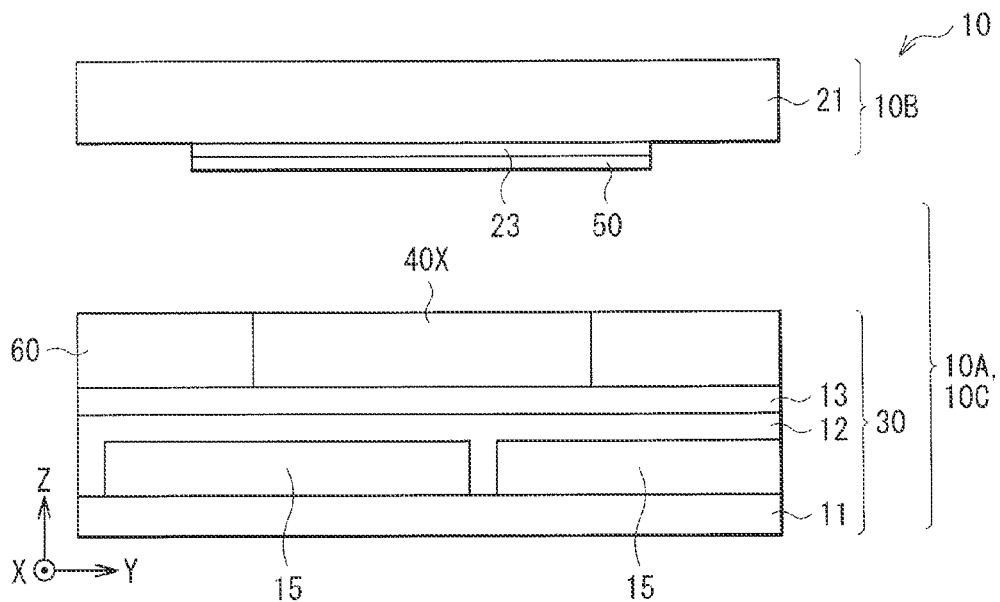
FIG. 33 is a view illustrating a nineteenth modification of the cross-sectional configuration of the display apparatus illustrated in FIG. 1.
FIG. 34 is a chart summarizing a relationship of elements described in the individual drawings.

In the above embodiment, the light-scattering section 50 may be relocated from the wiring substrate 30 to the support substrate 21, for example, as illustrated in FIGS. 24 and 25. In the above modification 1, the light-scattering section 50 may be relocated from the wiring substrate 30 to the support substrate 21, for example, as illustrated in FIGS. 26 and 27. In the above modification 2, the light-scattering section 50 may be relocated from the wiring substrate 30 to the support substrate 21, for example, as illustrated in FIG. 28, the above modification 3, the light-scattering section 50 may be relocated from the wiring substrate 30 to the support substrate 21, for example, as illustrated in FIG. 29. In the above modification 4, the light-scattering section 50 may be relocated from the wiring substrate 30 to the support substrate 21, for example, as illustrated in FIGS. 30 and 31. In the above modification 5, the light-scattering section 50 may be relocated from the wiring substrate 30 to the support substrate 21, for example, as illustrated in FIGS. 32 and 33. In the case where the color filter 23 and the light-scattering section 50 are stacked on the support substrate 21, desirably the color filter 23 may be disposed closer to the support substrate 21 than the light-scattering section 50.

In the above configurations, the light-scattering sections 50 are supported by the support substrate 21, and each of light-scattering sections 50 is provided above a corresponding one of the display pixels. Even in this case, the light beams emitted from the display pixels are scattered by the light-scattering sections 50, so that the dependence of the coloration on the viewing-angle is reduced. Furthermore, the light-scattering sections 50 are individually provided corresponding to the display pixels and above the corresponding display pixels. This configuration successfully achieves a higher contrast than a structure in which the light-scattering section is formed throughout the display region.

A relationship of the elements described in the individual drawings is summarized in FIG. 34. In FIG. 34, terms "lower-side BL" and "lower-side SL" refer to the light-shielding section 60 and the light-scattering section 50 disposed on the wiring substrate 30, respectively. Furthermore, in FIG. 34, terms "upper-side BL," "upper-side CL," and "upper-side SL" refer to the black matrix 22, the color filter 23, and the light-scattering section 50 disposed on the support substrate 21, respectively. Moreover, in FIG. 34, marks "○" and "×" represent the possession of a corresponding element and the non-possession of a corresponding element, respectively.

3. EXAMPLE

Next, Example of the display apparatus 1 will be described in comparison with Comparative example. In a display apparatus according to Example, respective LEDs for R, G, and B were provided in the display pixel; the three LEDs for R, G, and B contained in the display pixel were disposed within a region with lateral and vertical lengths of 50 μm and 100 μm, respectively. The LEDs were mounted on the support substrate, such that light beams emitted from the LEDs were output from an opposite side of the support substrate. The display pixels were arranged in a matrix fashion within a given region; the lateral and vertical arrangement pitches were 270 μm and 286 μm, respectively, and the region had vertical and vertical lengths of 625 mm and 1107 mm, respectively. As a result, LEDs were arranged in a matrix fashion with 4096 rows and 2180 columns. Each LED had a size of 17.5 μm per side.

A scattering layer having a size of 18 μm per side was formed for and above each LED. The scattering layer was formed by applying paint in which 5 wt % of titanium oxide having a particle size of about 2 μm is dispersed in silicone (KER6075 available from Shin-Etsu Chemical Co., Ltd.), so as to be about 20 μm thick with a screen printing method. Then, a black light-absorptive resist was filled in a gap between the display pixels with the screen printing method. However, no black resist was applied to the interior of each display pixel. In this way, the display apparatus according to Example had been produced.

On the other hand, as for a display apparatus according to Comparative example, the paint that had been produced in the above manner was applied to the overall surface including the upper surfaces of the LEDs. As a result, the scattering layer had been produced.

In the display apparatus according to Example, no light beam entered adjacent pixels. Therefore, blurring of an image was suppressed. In addition, the coloration of the image was hardly dependent on the viewing angle. In contrast, in the display apparatus according to Comparative example, the coloration of the image was also hardly dependent on the viewing angle. However, it was Observed that an image somewhat blurred and the resolution of the image was decreased.

Furthermore, the technology encompasses any possible combination of some or all of the various embodiments described herein and incorporated herein.

It is possible to achieve at least the following configurations from the above-described example embodiments of the disclosure.

(1) A substrate, including:
a plurality of pixels arranged two-dimensionally on a common wiring substrate, and each including a plurality of types of light emitting elements that differ from one another in emission color;
a plurality of light-scattering sections each provided for a corresponding one of the pixels, and each provided above the corresponding one of the pixels; and
a light-shielding section provided in a gap between adjacent ones of the pixels, or provided in an opposing region that opposes the gap when viewed in a normal direction of the wiring substrate.

(2) The substrate according to (1), wherein
the light-shielding section is provided entirely covering the gap when viewed in the normal direction of the wiring substrate, and
the light-scattering sections are provided in contact with the corresponding pixels.

(3) The substrate according to (1), further including a counter substrate disposed at an opposing site to the wiring substrate with a predetermined space therebetween, wherein
the light-shielding section and the light-scattering sections are supported by the counter substrate, and
the light-shielding section is provided entirely covering the opposing region when viewed in the normal direction of the wiring substrate.

(4) The substrate according to (3), further including a color filter provided above the pixels and supported by the counter substrate.

(5) A display panel provided with one or a plurality of substrates, the one or the plurality of substrates each including:
a plurality of pixels arranged two-dimensionally on a common wiring substrate, and each including a plurality of types of light emitting elements that differ from one another in emission color;
a plurality of light-scattering sections each provided for a corresponding one of the pixels, and each provided above the corresponding one of the pixels; and
a light-shielding section provided in a gap between adjacent ones of the pixels, or provided in an opposing region that opposes the gap when viewed in a normal direction of the wiring substrate.

(6) A display apparatus provided with a display panel, the display panel being provided with one or a plurality of substrates, the one or the plurality of substrates each including:
a plurality of pixels arranged two-dimensionally on a common wiring substrate, and each including a plurality of types of light emitting elements that differ from one another in emission color;
a plurality of light-scattering sections each provided for a corresponding one of the pixels, and each provided above the corresponding one of the pixels; and
a light-shielding section provided in a gap between adjacent ones of the pixels, or provided in an opposing region that opposes the gap when viewed in a normal direction of the wiring substrate.

It should be understood by those skilled in the art that various modifications, combinations, sub-combinations and alterations may occur depending on design requirements and other factors insofar as they are within the scope of the appended claims or the equivalents thereof

What is claimed is:

1. A substrate, comprising:
   pixels of different colors arranged two-dimensionally on a common wiring substrate, respectively including light emitting elements;
   light-scattering sections respectively provided for corresponding ones of the light emitting elements, and respectively provided above the corresponding ones of the respective light emitting elements and in contact with only a portion of an upper surface of the respective light emitting elements; and
   a light-shielding section provided in gaps between adjacent ones of the light emitting elements, and an upper surface of the light-shielding section being coplanar with the upper surfaces of the light scattering sections.

2. A display panel comprising:
   pixels of different colors arranged two-dimensionally on a common wiring substrate, respectively including light emitting elements;
   light-scattering sections respectively provided for corresponding ones of the light emitting elements, and respectively provided above the corresponding ones of the respective light emitting elements and in contact with only a portion of an upper surface of the respective light emitting elements; and
   a light-shielding section provided in gaps between adjacent ones of the light emitting elements, and an upper surface of the light-shielding section being coplanar with the upper surfaces of the light scattering sections.

3. A display apparatus including a display panel, the display panel comprising:
   pixels of different colors arranged two-dimensionally on a common wiring substrate, respectively including light emitting elements;
   light-scattering sections respectively provided for corresponding ones of the light emitting elements, and respectively provided above the corresponding ones of the respective light emitting elements and in contact with only a portion of an upper surface of the respective light emitting elements; and
   a light-shielding section provided in gaps between adjacent ones of the light emitting elements, and an upper surface of the light-shielding section being coplanar with the upper surfaces of the light scattering sections.

4. The substrate according to claim 1, further comprising an insulating layer, the light emitting elements and the light shielding section being in contact with an upper surface of the insulating layer.

5. The substrate according to claim 1, further comprising an insulating layer, wherein the light shielding section is positioned between and in contact with an upper surface of the insulating layer and a lower surface of a black matrix layer formed on an opposing substrate.

6. The display panel according to claim 2, further comprising an insulating layer, the light emitting elements and the light shielding section being in contact with an upper surface of the insulating layer.

7. The display panel according to claim 2, further comprising an insulating layer, wherein the light shielding section is positioned between and in contact with an upper surface of the insulating layer and a lower surface of a black matrix layer formed on an opposing substrate.

8. The display apparatus according to claim 3, further comprising an insulating layer, the light emitting elements and the light shielding section being in contact with an upper surface of the insulating layer.

9. The display apparatus according to claim 3, further comprising an insulating layer, wherein the light shielding section is positioned between and in contact with an upper surface of the insulating layer and a lower surface of a black matrix layer formed on an opposing substrate.

* * * * *